United States Patent
Chatterjee et al.

[11] Patent Number: 5,907,462
[45] Date of Patent: May 25, 1999

[54] GATE COUPLED SCR FOR ESD PROTECTION CIRCUITS

[75] Inventors: Amitava Chatterjee; Charvaka Duvvury, both of Plano; Ping Yang, Richardson; Ekanayake Ajith Amerasekera, Plano, all of Tex.

[73] Assignee: Texas Instruments Incorporated, Dallas, Tex.

[21] Appl. No.: 08/302,145

[22] Filed: Sep. 7, 1994

[51] Int. Cl.$^6$ ...................................................... H02H 9/00
[52] U.S. Cl. ............................................. 361/56; 361/111
[58] Field of Search .................................. 361/56, 58, 91, 361/111, 118, 119, 126, 127; 257/355–360

[56] References Cited

U.S. PATENT DOCUMENTS

| | | | |
|---|---|---|---|
| 3,891,866 | 6/1975 | Okuhara et al. | 361/58 |
| 4,400,711 | 8/1983 | Avery | 357/43 |
| 4,567,500 | 1/1986 | Avery | 357/38 |
| 4,633,283 | 12/1986 | Avery | 361/91 |
| 4,739,438 | 4/1988 | Sato | 361/91 |
| 4,896,243 | 1/1990 | Chatterjee et al. | 362/91 |
| 4,939,616 | 7/1990 | Roundtree | 361/56 |
| 5,072,273 | 12/1991 | Avery | 357/38 |
| 5,144,517 | 9/1992 | Wieth | 361/55 |
| 5,225,702 | 7/1993 | Chatterjee | 257/360 |
| 5,274,262 | 12/1993 | Avery | 257/362 |
| 5,359,211 | 10/1994 | Croft | 361/91 |
| 5,400,202 | 3/1995 | Metz et al. | 361/56 |
| 5,528,188 | 6/1996 | Au et al. | 361/56 |

OTHER PUBLICATIONS

Amitava Chatterjee and Thomas Polgreen, "A Low–Voltage Triggering SCR For On–Chip ESD Protection at Output and Input Pads", 1990 Symposiium on VLSI Technology, pp. 75–76. No Month.

Amitava Chatterjee and Thomas Polgreen, "A Low–Voltage Triggering SCR For On–Chip ESD Protection at Output and Input Pads", IEEE Electron Devices Letters, vol. 12, No. 1, Jan. 1991, pp. 21–22.

Ajith Amerasekera and Amitava Chatterjee, "An Investigation of BiCMOS ESD Protection Circuit Elements and Applications in Submicron Technologies", EOS/ESD Symposium 92–265, p. 5B.6.1. Sep. 1992.

L.R. Avery, "Using SCR's As Transient Protection Structures in Integrated Circuits", EOS/ESD 1983, pp. 177–180. No Month.

Primary Examiner—Jeffrey A. Gaffin
Assistant Examiner—Ronald W. Leja
Attorney, Agent, or Firm—Jacqueline J. Garner; W. James Brady, III; Richard L. Donaldson

[57] ABSTRACT

A protection device comprising a gate-coupled silicon-controlled rectifier (SCR) (100), SCR (100) comprises an anode (105) formed in n-well (104) and connected to a pad (128) and a cathode (111) connected to ground. A gate-coupled NMOS transistor (120) has a gate (116) connected through a resistive element (118) to ground. A n+ region (112) forms both the cathode (111) and a source of the NMOS transistor (120). N-well (104) forms the drain. Stress voltage is coupled from pad (128) to gate electrode (116) causing NMOS transistor (120) to conduct. This, in turn, triggers SCR (100) which dissipates the stress current at the pad (128). The coupled voltage at gate electrode (116) dissipates within a designed time constant through resistive element (118).

20 Claims, 3 Drawing Sheets

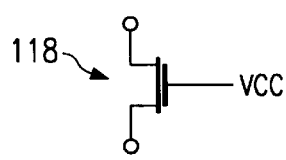
FIG. 5
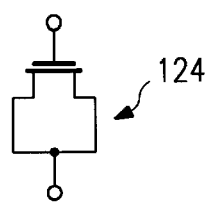
FIG. 7
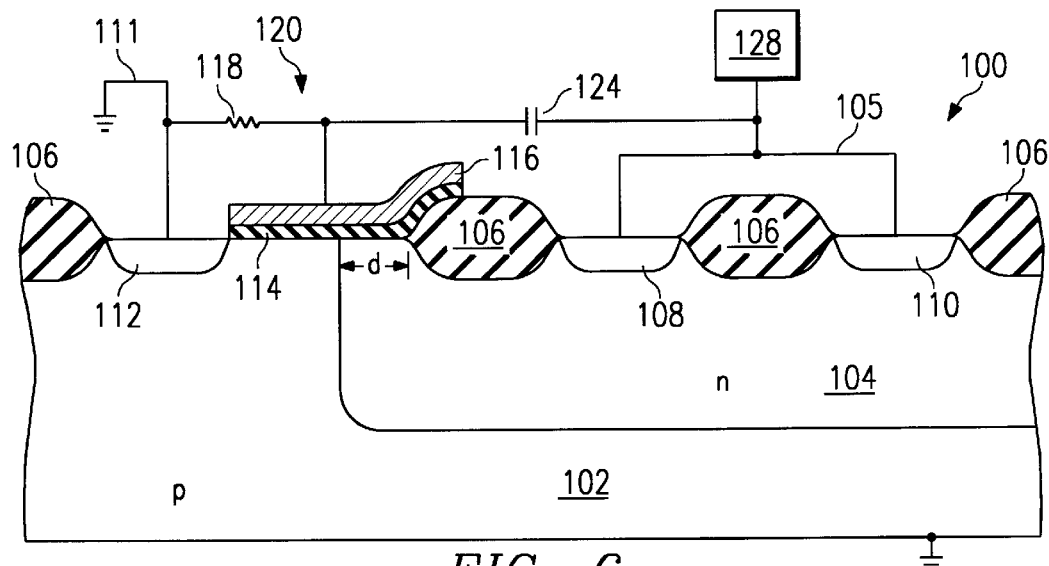
FIG. 6
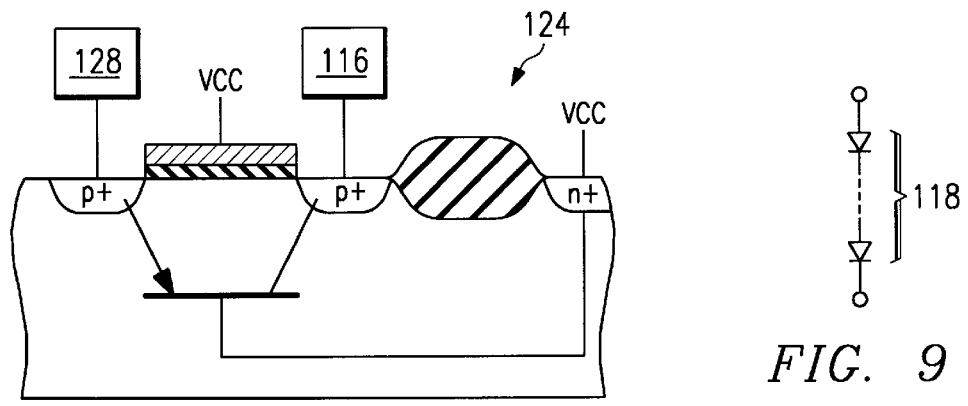
FIG. 8
FIG. 9

GATE COUPLED SCR FOR ESD PROTECTION CIRCUITS

FIELD OF THE INVENTION

This invention generally relates to the field of integrated circuits and more specifically to protection circuits for integrated circuits.

BACKGROUND OF THE INVENTION

Electrostatic discharge (ESD) may cause damage to semiconductor devices on an integrated circuit during handling of the integrated circuit chip package. Prevention of such damage generally is provided by protection circuits incorporated into the chip of the integrated circuit. In general, such protection circuits include a switch that is capable of conducting relatively large currents during an ESD event. Various devices such as a Silicon Controlled Rectifier (SCR) can be utilized to provide the switching function required to essentially shunt the protected circuitry during an ESD event. Previous circuits and structures used for ESD protection can withstand high levels of ESD stress. However, recent advances in technology have produced devices which can fail at voltage levels lower than the triggering voltages of prior art protection circuits.

SCR protection devices that use a gate electrode to lower their trigger voltages are shown in FIGS. 1a and 1b. These protection devices are gated SCR structures 10 having a polysilicon gate 12 connected to ground. SCR structures 10 comprise a p+ region 16, an n+ region 18, both of which are located in an n-well 20, an n+ region 24 located in the p-substrate 30 and polysilicon gate 12. The gate electrode 12 is separated from the silicon regions below it by a thin (~50Å–200Å) oxide layer 32. In FIG. 1a, gate electrode 12 extends onto an adjacent field oxide region, whereas in FIG. 1b it does not. Typically, p+ region 16 and n+ region 18 are electrically connected and form one terminal of the device 14 connected to the input/output bond pad. The gate 12 and the n+ region 24 are connected together and form the other terminal 22 which is usually connected to ground. The p-substrate 30 may also be connected to ground, depending on the application. When an excess voltage appears at the terminal 14, the presence of the thin oxide 32 and the gate 12 raises the electric field in response to which the device will begin to conduct current at a lower voltage level than the triggering voltage of a typical SCR without the gate and the thin oxide. The current triggers SCR structure 10 to a low-impedance state, which, in turn, dissipates the ESD event. Polysilicon gate 12 connected to ground thus reduces the triggering voltage of a typical SCR structure from about 50 volts to about 24 volts for the structure of FIG. 1a and to about 15 V for the structure of FIG. 1b. Unfortunately, an even lower trigger voltage is required for many of today's more advanced circuits.

Another protection device having a low triggering voltage is shown in FIG. 2. FIG. 2 illustrates a large nMOS transistor 40 having its gate tied through a resistor 42 to ground 44. The drain of the nMOS transistor 40 is connected to output pad 46 and the source is connected to ground 44. Output pad 46 is also connected to internal circuitry 48. Inherent in the structure of nMOS transistor 40 are two parasitic capacitances 50 and 52. During normal operation, transistor 40 is non-conducting. However, when an excess voltage appears at pad 46, parasitic capacitor 50 will also bump up the voltage at the gate of nMOS transistor 50. When the voltage at the gate exceeds the turn-on voltage of transistor 40, transistor 40 will begin to conduct and discharge the excess voltage, thereby protecting internal circuitry 48. Resistor 42 allows the voltage at the gate to relax back to ground in a given amount of time determined by the product of the resistor 42 and capacitor 52 and the ratio of the parasitic capacitances 50 and 52.

Although transistor 40 can be designed to trigger at a sufficiently low voltage, there are two disadvantages in using this type of protection device. The first disadvantage is area. In order to dissipate sufficient amounts of energy, transistor 40 must be large (e.g., on the order of ten thousand square microns). A second disadvantage of transistor 40 is that it adds significant capacitance to that which must be driven by the internal circuitry. A third disadvantage of transistor 40 is that an nMOS transistor heats up more than an SCR. Hence, it is not able to withstand as severe an ESD stress in comparison to an SCR device. Accordingly, there is a need for a protection device that has a low triggering voltage, low input capacitance, and that requires a small area.

SUMMARY OF THE INVENTION

An improved protection device having a gate-coupled SCR with a gate connected through a resistor to ground is disclosed herein. The gate-coupling circuitry forms a MOS transistor and lowers the trigger voltage of the SCR to approximately equal to or less than the on-state breakdown voltage of an NMOS transistor. The resistive element used to relax the gate voltage to ground, may, for example, comprise a resistor or an nMOS transistor. In one embodiment, capacitive coupling is increased by connecting a discrete capacitor between the gate and the pad.

During a stress event, either the discrete capacitor (if present) or the inherent gate-to-drain capacitance of the integrated MOS transistor provides sufficient voltage to the gate to turn the MOS transistor on. Enough current dissipates through the gate-coupled MOS transistor to trigger the SCR. The SCR dissipates the remainder of the stress current. The product of the resistive element of the gate-coupled MOS transistor and the gate capacitance to ground determines the time-constant for returning the gate voltage to ground.

An advantage of the invention is providing a protection device having a low trigger voltage.

A further advantage of the invention is providing a protection device having small area and low input capacitance.

A further advantage of the invention is providing a protection device having a low on-state impedance.

A further advantage of the invention is providing a protection device that has less heating under stress events.

These and other advantages will be apparent to those skilled in the art having reference to the specification in conjunction with the drawings.

BRIEF DESCRIPTION OF THE DRAWINGS

In the drawings:

FIG. 5 is a schematic diagram of a resistive element to be used in the protection devices of FIGS. 3 and 4;

FIG. 6 is a partly schematic/partly cross-sectional diagram of another alternative embodiment protection device according to the invention;

FIG. 7 is a schematic diagram of a capacitive element to be used in the protection device of FIG. 6;

FIG. 8 is a schematic diagram of a coupling element to be used in the protection device of FIG. 6; and FIG. 9 is a schematic diagram of a resistive element comprising a stack of diodes to be used in the protection devices of FIGS. 3 and 4.

Corresponding numerals and symbols in the different figures refer to corresponding parts unless otherwise indicated.

DETAILED DESCRIPTION OF PREFERRED EMBODIMENTS

The invention will be described in conjunction with a protection device for output pads of a low voltage integrated circuit (IC). It will be apparent to those skilled in the art that the invention is also applicable to other applications such as input pads and higher voltage ICs.

Figure 1A:
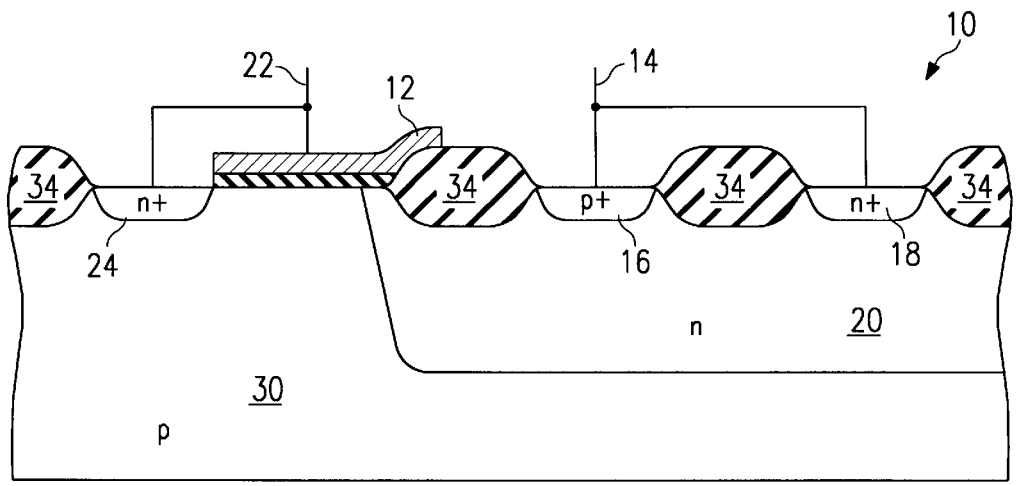
FIG. 1a–b are cross-sectional diagrams of prior art SCR protection devices.
Figure 1B:
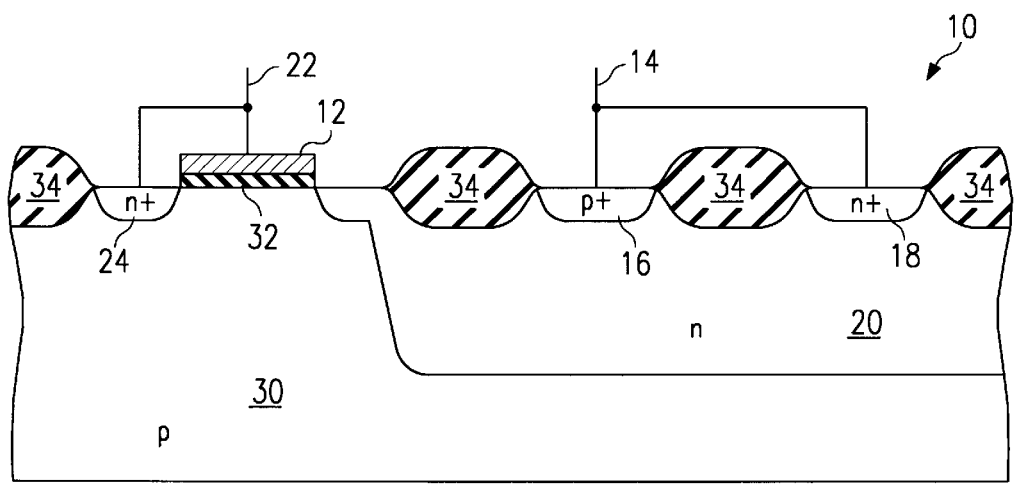
Figure 2:
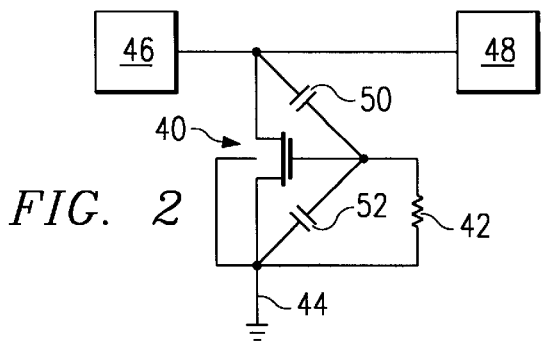
FIG. 2 is a schematic diagram of a prior art gate-coupled nMOS protection device.
Figure 3:
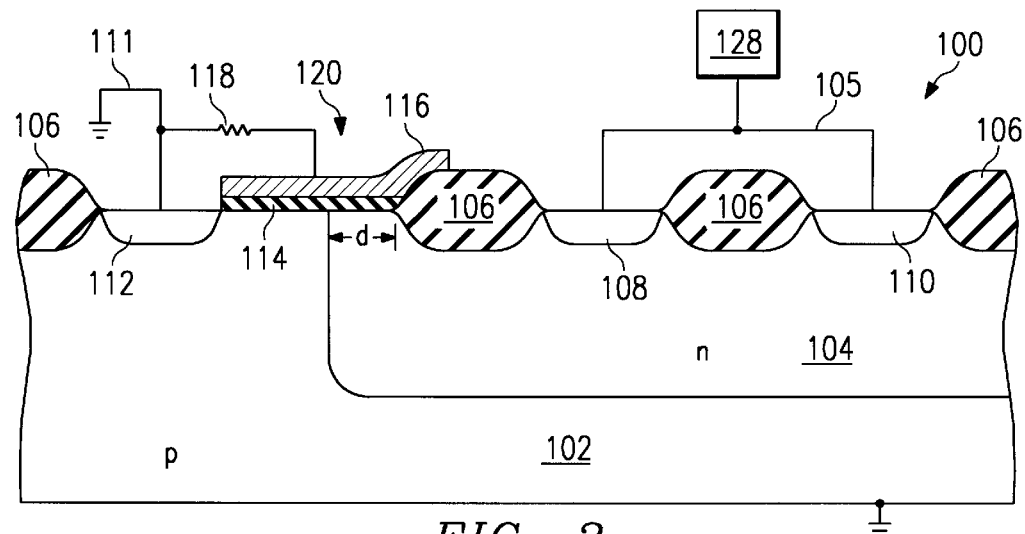
FIG. 3 is a partly schematic/partly cross-sectional diagram of a protection device according to the invention.

A protection device according to the invention is shown in FIG. 3. The protection device is a gate-coupled SCR 100. Gate-coupled SCR 100 includes a nMOS transistor 120 with its gate tied through a resistor 118 to ground. Device 100 is formed in a substrate 102. The anode 105 of the SCR 100 comprises a p+ region 108 and n+ region 110 located in n-well 104. N-well 104 is lightly doped with a n-type dopant such as phosphorous. Regions 108 and 110 are connected together and to output pad 128 to prevent forward biasing of the pnp formed by regions 102, 104, and 108. The cathode 111 of SCR 100 comprises a n+ region 112 formed directly in substrate 102. Region 112 is connected to ground.

Figure 4:
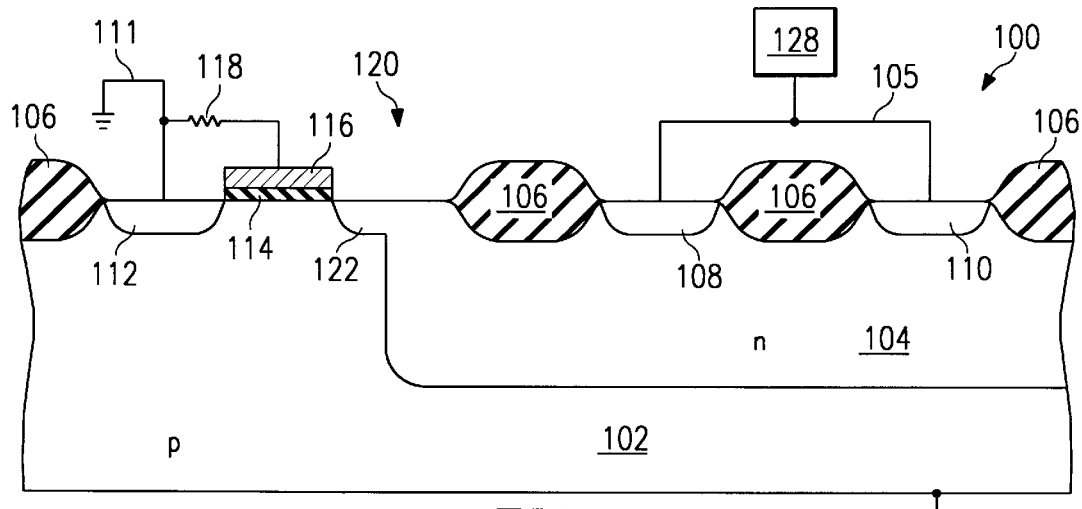
FIG. 4 is a partly schematic/partly cross-sectional diagram of an alternative embodiment protection device according to the invention.

Gate-coupled nMOS transistor 120 has a polysilicon gate 116 and gate oxide 114. Polysilicon gate 116 may extend over a portion of field oxide region 106, as shown in FIG. 3. Alternatively, polysilicon gate 116 may not extend all the way to the field oxide region 106 as shown in FIG. 4. In this case an additional n+ region 122 forms to serve as the drain region, as shown in FIG. 4. Preferably, however, n+ region 122 is not present due to several reasons. First, without n+ region 122, a wider path for the stress current dissipation may be established resulting in less heating. Second, by eliminating n+ region 122 one can vary the coupling capacitance by simply varying the dimension 'd' of FIG. 3. Otherwise, one can only vary the coupling by using an extra discrete capacitor as will be discussed herein below. Finally, eliminating n+ region 122 saves device area. Referring back to FIG. 3, n+ region 112 forms a source region of transistor 120 and n-well 104 (or n+ region 122) forms the drain region.

Polysilicon gate 116 is connected through a resistive element 118 to ground. Resistive element 118 may comprise a resistor (such as a diffused region or a polysilicon resistor), a stack of diodes, (FIG. 9) a nMOS transistor, or other resistive element. If a nMOS transistor is used, a long channel length is desired for high resistance and the gate of the transistor is tied to the supply voltage, Vcc, as shown in FIG. 5.

In normal operation, both gate-coupled transistor 120 and SCR 100 will be non-conducting. However, under a stress event, the stress voltage is coupled from the pad 128 to the gate 116 through the parasitic overlap capacitance that exists between the gate 116 and the drain (n-well 104). Because gate 116 is not tied directly to ground, a fraction of the stress voltage appears at the gate 116, thus causing transistor 120 to conduct. The voltage coupling depends on the ratio of the gate-to-drain capacitance and the total gate capacitance to ground. Thus, the voltage to which the gate is bumped up may be varied by varying the overlap distance "d" and thus the gate-to-drain overlap capacitance. The gate voltage needs to couple sufficiently high in order to turn on the MOS transistor 120. Sufficient current being conducted through transistor 120 triggers SCR 100. SCR 100 then dissipates the remaining stress current.

The portion of the stress voltage coupled to the gate 116 will relax to ground through resistive element 118 over a certain period of time depending on the time constant. The time constant depends on the product of the resistance of resistive element 118 and the total gate capacitance to ground. Thus, the time constant may be varied by varying the value of resistive element 118. A time constant on the order of 10 nsec is preferably used. Thus, depending on the gate capacitance to ground, a resistance value on the order of 10K to 1M ohms may be appropriate. For example, given a time constant of 10 nsec and a gate-to-ground capacitance of 0.1 pF, a resistance on the order of 100 KΩ is desired.

The trigger voltage for this device is the voltage at pad 128 corresponding to which the gate potential couples to a voltage that exceeds the threshold voltage of transistor 120. Preferably, this is designed to be below that which would stress the internal circuitry being protected. For some low voltage devices, this is less than 15 volts. The trigger voltage should be high enough so that the device does not trigger during normal circuit operation. Thus, the trigger voltage needs to be greater than the supply voltage connected to Vcc.

Gate-coupled transistor 120 lowers the trigger voltage of the protection device so that ICs which have input/output devices that may be damaged at low voltages can be protected. Transistor 120 can be much smaller than prior art gate-coupled NMOS protection transistors because SCR 100 dissipates most of the stress current instead of transistor 120. SCR 100 provides a much lower on-state impedance and therefore generates less heat in dissipating stress current than a MOS transistor. Lower on-state impedance gives the added advantage of being able to dissipate a higher ESD stress current before the voltage experienced by the weaker input/output device exceeds its damage threshold. A further advantage of SCR 100 is that its input capacitance is much lower and hence does not significantly increase the capacitance load at the input/output pad. Accordingly, the advantages of a gate-coupled NMOS transistor (low trigger voltage) are combined with the advantages of SCRs (less area, less capacitance, less heat generation) to create an improved protection device.

An alternative embodiment of the invention is shown in FIG. 6. Included in gate-coupled SCR 100 is a discrete capacitor 124 connected between the output pad 128 and gate 116. (A similar embodiment may be achieved using the SCR of FIG. 4.) In this embodiment, stress voltage occurring at output 128 is coupled to gate 116 through capacitor 124 instead of through the parasitic gate-to-drain overlap capacitance as in the first embodiment. Having a discrete capacitor increases the control over and amount of capacitance that can be designed into the structure.

One example of a capacitive structure is shown in FIG. 7. FIG. 7 shows a capacitor 124 comprising a MOS transistor having its source and drain tied together and to either the output pad 128 or gate 116 and its gate tied to the other of the output pad 128 or gate 116.

FIG. 8 shows a scheme which may be used as an alternative to capacitance coupling to couple the gate voltage high in response to an ESD stress. This scheme comprises a pMOS transistor and associated parasitic pnp bipolar transistor. One source/drain region is tied to the output pad 128 and the other source/drain region is tied to gate 116. The gate is tied to Vcc. The n-well which is the base of the parasitic bipolar transistor is also tied to Vcc. During ESD stress there is no power supply connected to Vcc. Consequently, the potential at the gate of the pMOS device and the base of the parasitic pnp is low. Thus, the pMOS and the parasitic pnp may conduct current in response to a voltage at pad 128. This current may serve to raise the potential at the gate 116 of the protection device. During normal operation, Vcc is connected to a positive power supply, e.g. 5 V. This may prevent the PMOS and the parasitic pnp from conducting current. Other structures for coupling the pad voltage to the gate 116 will be apparent to those skilled in the art having reference to the specification.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A protection device comprising a gate-coupled silicon-controlled rectifier (SCR) connected to a pad and incorporating a NMOS transistor, said NMOS transistor having a gate electrode electrically connected through a resistive element to ground.

2. The device of claim 1, wherein said resistive element is a resistor.

3. The device of claim 1, wherein said resistive element is a second NMOS transistor having a gate connected to a supply voltage.

4. The device of claim 1, wherein said resistive element is a diode stack.

5. The device of claim 1, wherein said resistive element is greater than 10K ohms.

6. The device of claim 1, wherein said protection device has a trigger voltage greater than a supply voltage and less than 15 volts.

7. The device of claim 1, further comprising a discrete capacitor connected between said gate eletrode and an output pad.

8. The device of claim 7, wherein said discrete capacitor is a MOS transistor having its source and drain connected together.

9. The device of claim 1, further comprising a PMOS transistor having a source connected to said gate electrode a drain connected to said pad and a PMOS gate connected to a supply voltage, and a body node connected to said supply voltage to provide coupling between said gate electrode and the pad.

10. A protection device for protecting internal circuitry of an integrated circuit, comprising:

a. a silicon-controlled rectifier (SCR) having an anode formed in a n-well and connected to a pad and a cathode formed in a substrate and connected to ground; and b. a gate-coupled NMOS transistor having a gate electrode tied through a resistive element to ground, wherein said cathode forms a source region of said gate-coupled NMOS transistor.

11. The device of claim 10, wherein said n-well forms a drain region of the gate-coupled NMOS transistor.

12. The device of claim 10, further comprising a n-type doped region at a surface of said substrate at an edge of said n-well, wherein said n-type doped region forms a drain of said gate-coupled NMOS transistor.

13. The protection device of claim 10, wherein said gate electrode extends over said n-well and onto a field oxide region.

14. The protection device of claim 10, wherein there is capacitive coupling, said capacitive coupling being the ratio of the gate-to-drain capacitance and the total gate capacitance to ground of the gate-coupled NMOS transistor and is selected such that a product of the capacitive coupling and a supply voltage is less than a threshold voltage of the gate-coupled NMOS transistor.

15. The protection device of claim 14, wherein a product of the capacitive coupling and a breakdown voltage of said internal circuitry is greater than the threshold voltage of the gate-coupled NMOS transistor.

16. The protection device of claim 10, further comprising a discrete capacitor connected between said pad and said gate electrode for coupling a stress voltage from said pad to said gate electrode.

17. A method of protecting internal circuitry of an integrated circuit, comprising the steps of:

a. coupling a stress voltage from a pad to a gate electrode of a NMOS transistor;

b. conducting current in said NMOS transistor is response to said coupled stress voltage;

c. triggering an SCR in response to said step of conducting current in said NMOS transistor to dissipate said stress voltage at said gate electrode; and d. dissipating said coupled stress voltage from said gate electrode through a resistor to ground.

18. The method of claim 17, wherein said step of dissipating said coupled stress voltage occurs in a time constant on the order of 10 nsec.

19. The method of claim 17, wherein said step of conducting current in said NMOS transistor occurs when said stress voltage at the pad reaches a selected voltage greater than a supply voltage.

20. An ESD protection circuit comprising:

a lateral silicon-controlled rectifier (SCR) structure connected to a pad;

a NMOS transistor located in the lateral SCR structure to lower a trigger voltage of said lateral SCR structure;

a capacitor located between said pad and a gate of said NMOS transistor to couple an ESD-transient voltage to the gate of said NMOS transistor; and a resistance located between said gate of said NMOS transistor and ground to sustain the coupled ESD-transient voltage longer in time to effectively turn on the SCR.

* * * * *